United States Patent [19]

Barr

[11] Patent Number: 5,504,999

[45] Date of Patent: Apr. 9, 1996

[54] METHOD AND APPARATUS FOR COMPENSATING FOR PROCESS VARIATIONS IN AN AUTOMATIC POSITIONING SYSTEM

[75] Inventor: Ronald A. Barr, Mountain View, Calif.

[73] Assignee: Read-Rite Corporation, Milpitas, Calif.

[21] Appl. No.: 217,550

[22] Filed: Mar. 25, 1994

Related U.S. Application Data

[63] Continuation-in-part of Ser. No. 986,345, Dec. 7, 1992, abandoned.

[51] Int. Cl.⁶ .............................. G01B 11/00; H01L 21/30
[52] U.S. Cl. ............................. 33/286; 33/645; 437/924
[58] Field of Search ........................... 33/286, 613, 614, 33/617, 619, 620, 621, 623, 644, 645; 356/401; 437/924

[56] References Cited

U.S. PATENT DOCUMENTS 5,283,205  2/1994  Sakamoto ............................. 437/924 X

FOREIGN PATENT DOCUMENTS 0045946  3/1982  Japan ..................................... 437/924
0142532  8/1983  Japan ..................................... 437/924

OTHER PUBLICATIONS

Kenneth G. Clark, "Automatic Mask Alignment in MOS/LSI Processing", Microelectronics, vol. 3 No. 9, 1970. pp. 47–55.

A. S. Jones, "Artwork Registration System", IBM Technical Disclosure Bulletin, vol. 19 No. 6, p. 2224, Nov. 1976.

*Primary Examiner*—Alvin Wirthlin
*Attorney, Agent, or Firm*—Nathan N. Kallman

[57] ABSTRACT

A target for use in automatic positioning systems that allows the automatic positioning system to align an edge in the pattern laid down with the target on a substrate with an edge in the pattern on a mask. The target compensates for variations in the size of the target and the target's associated pattern due to process variations in forming the target from an initial mask having the target and pattern. The target is symmetrical about a first axis and asymmetrical about a second axis where the first and second axes are orthogonal to each other. The target has two edges that will be detected by a sensing device in the automatic positioning system when the target is scanned along one axis and one edge that will be detected by the sensing device when the target is scanned along the other axis. The positioning system will detect the center of the target as being in the middle of the location of the two detected edges in one axis and the location of the detected edge in the other axis. The center of the target will move as a function of the location of the single edge thereby compensating for process variations in the formation of the target.

3 Claims, 2 Drawing Sheets

METHOD AND APPARATUS FOR COMPENSATING FOR PROCESS VARIATIONS IN AN AUTOMATIC POSITIONING SYSTEM

CROSS-REFERENCE TO RELATED PATENTS

This application is a continuation in part of Ser. No. 07/986,345, filed Dec. 7, 1992, now abandoned.

BACKGROUND OF THE INVENTION

1. Field of the Invention

The present invention relates to an automatic positioning system for aligning a target on a first object with a key on a second object. More specifically, the invention relates to a target that provides compensation for processing variations in generating the target.

2. Description of the Related Art

A plurality of masks are used in the manufacturing process of semiconductors and thin film magnetic transducers. Automatic positioning systems are used to align each mask with the substrate upon which the device is being manufactured. Such a positioning system is the Ultrateck STEPPER 2000/2700 and a description of how the positioning system actual works can be obtained from Ultrateck Inc., Attention Technical Training Documentation, 3250 Scott Blvd., Santa Clara, Calif. 95054.

Normally during the processing, a mask is used to place a target and a first pattern on the substrate. Subsequent masks contain a key and a pattern, where the pattern on the subsequent masks are to be located in a specified spacial relationship with regards to either the first pattern or prior patterns established by prior subsequent masks. The positioning system uses the target on the substrate and the key on each of the subsequent masks to establish the spacial relationship of a pattern on substrate to the patterns on the subsequent masks.

Referring to FIG. 1, an illustration of the relationship between the target 11 on the substrate 10 and the key 21 on mask 20 is shown. At present, the target 11 usually takes the form of a cross which is symmetrical about the center 13 of the orthogonal axes. The pattern, represented by the square 14 with center 16, was established on the substrate 10 at the same time as the target 11. On mask 20, a key 21, usually in the form of a cross approximately the same size as the cross of target 11, is used through which the substrate is monitored by a sensing mechanism within the positioning system. The pattern, represented by square 24 having center 26, on mask 20 is to be positioned in a spacial relationship with square 14 on substrate 10. It is normally desired to have the center 26 of square 24 aligned with the center 16 of square 14.

The positioning system first positions the substrate such that the scanning area of the positioning system will not experience the ends of the legs of cross 11. The positioning system will move the substrate the scanning distance first along a horizontal plane and the edges of the vertical legs of cross 11 will be detected through key 21 by the sensing mechanism whose output is a signal containing information as to the location of the two edges of the vertical legs of target 11 with relationship to key 21 which is used to determine the center of the target in the horizontal plane. The positioning system will next move the substrate the scanning distance along a vertical plane and the edges of the horizontal legs of cross 11 will be detected through key 21 by the sensing mechanism whose output is a signal containing information as to the location of the two edges of the horizontal legs of target 11 with relationship to the center 13 of key 21 which is used to determine the center of the target in the vertical plane. Once the system has determined the location of the center of target 11 with reference to the center 13 of key 21, the system can then move the substrate 10 such that the center 16 of square 14 matches the center 26 of square 24. By using the center of the target 11, the system is self compensating for process variation in the target 11 as long as the requirements are to match centers of the pattern on the substrate and the pattern on the mask.

This self correcting feature is exemplified by a target 12 (shown in dotted lines) and square 15 (shown in dotted lines). Here the target 12 was designed to be of the size of target 11 and the square 14 was designed to be the size of square 14. However, due to process variations the resulting size of target 11 and square 14 was smaller than the target 11 and square 14 on the mask used to lay down the target 11 and square 14. Since the target and the pattern are exposed to the same process variations, the change in target and pattern size will be the same. Even though the resultant size of target 12 and square 14 were smaller, the centers of target 12 and square 14 were not changed. Therefore the positioning system will find the same center for target 12 as it did for target 11 and will match the center 16 of target 15 with center 26 of square 24 on mask 20.

Since square 24 is the same size as square 14, it can be seen that although the center 16 of square 15 matches the center 26 of square 24 the edges of square 24 do not match the edges of square 15.

In some designs, specially in the manufacture of thin film magnetic transducers, it is critical to match an edge on the substrate to an edge on the mask. As can be seen from the forgoing description, process variations of the target can result in losing the relationship between the edges on the substrate and the edges of the mask.

SUMMARY OF THE INVENTION

Accordingly it is an object of the present invention to provide a target that compensates for process variation in forming the target such that the positioning system will maintain a constant spacial relationship of edges on the substrate with edges on the mask.

It is another object of the invention to provide a target which allow the positioning system to maintain a constant spacial relationship between edges on the substrate and edges on the mask without requiring any changes to the positioning system other than the shape of the target.

Briefly, the present invention provides a target for use in automatic positioning systems that allows the automatic positioning system to align an edge in the pattern laid down with the target on a substrate with an edge in the pattern on a mask without. The target compensates for variations in the size of the target and the target's associated pattern due to process variations in forming the target from an initial mask having the target and pattern. The target is symmetrical about a first axis and asymmetrical about a second axis where the first and second axes are orthogonal to each other. The target has two edges that will be detected by a sensing device in the automatic positioning system when the target is scanned along one axis and one edge that will be detected by the sensing device when the target is scan along the other axis. The positioning system will detect the center of the target as being in the middle of the location of the two detected edges in one axis and the location of the detected edge in the other axis. The center of the target will move as a function of the location of the single edge thereby compensating for process variations in the formation of the target.

An advantage of the asymmetrical target is that since process variations effect the target and the pattern associated with the target in the same way, a constant spacial relationship can be maintained between the single edge of the target and edges in the pattern.

Another advantage of the invention is that a constant spacial relationship between edges on the substrate and edges on a subsequent mask can be maintained by the positioning system without requiring any changes to the positioning system.

BRIEF DESCRIPTION OF THE DRAWINGS

The invention will be described with respect to the particular embodiments thereof and reference will be made to the drawings, in which.

DESCRIPTION OF THE PREFERRED EMBODIMENTS

Figures 2A, 2B:
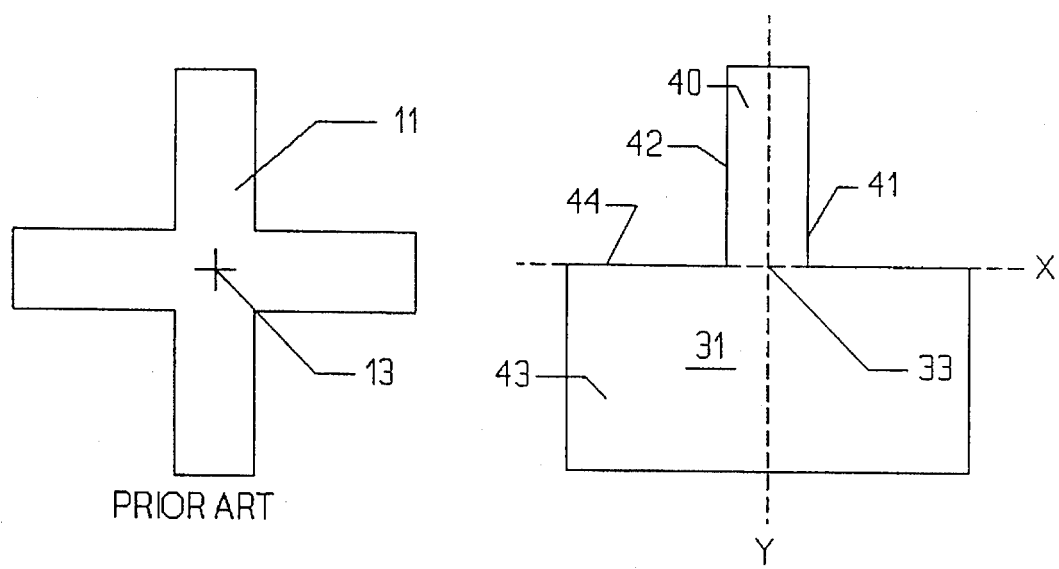
FIG. 2A is a drawing of the prior art symmetrical target.
FIG. 2B is a drawing of the new asymmetrical target of the invention.

Referring to FIG. 2A and 2B, the prior art cross target 11, which is symmetrical about center 13, is shown in comparison with the new target 31, which is asymmetrical about center 33. Target 31 should have the same outer dimensions as target 11 such that the scanning procedure of the positioning system will present only edges 41 and 42 of leg 40 of target 31 and edge 44 of base 43 of target 31 to the sensing device which views the substrate through the key on the mask. The width of the leg 40 of target 31 should be the same as the width of the legs of prior art target 11, that, is approximately 20% of the minimum scan distance used by the automatic positioning system. Leg 40 of target 31 is centered around the y axis and bounded on one side by the x axis of an orthogonal pair of axes, x and y. Base 43 has one edge 44 located on the x axis. The center of target 31 is defined as the mid point location between edges 41 and 42 of leg 40 along the x axis and the location of edge 44 of base 43 along the y axis.

Figure 1:
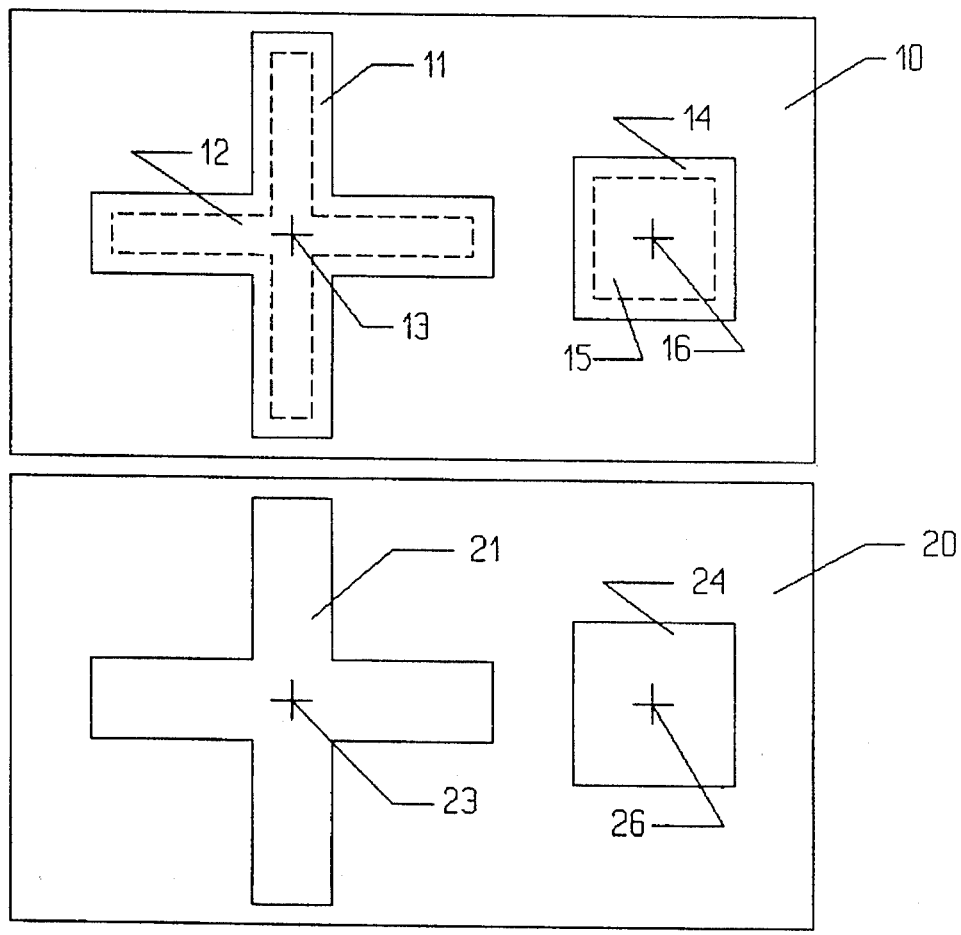
FIG. 1 is a drawing which illustrates the prior art target and key used in automatic positioning systems.
Figure 3:
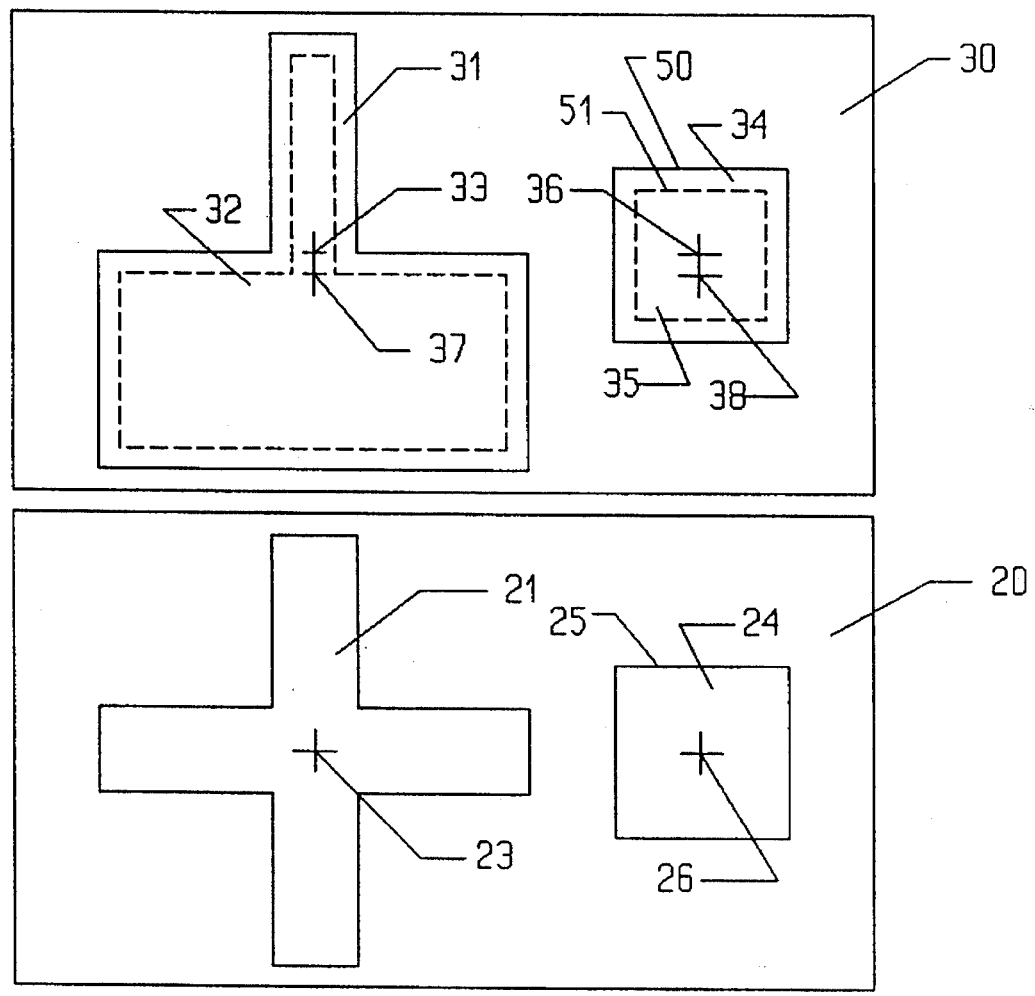
FIG. 3 is a drawing which illustrates the use of the asymmetrical target of the invention with a prior art key being used in a prior art automatic positioning system.

The operation of the invention with a prior art positioning system will be discussed with reference to FIG. 3. Substrate 30 is shown to include target 31 having edge 44 and center 33 and a pattern represented by square 34 having edge 50 and center 36. Mask 20, the same mask as shown in FIG. 1, includes the cross key 21 having a center 23 and a pattern represented by square 24 having edge 25 and center 26. If no process variation occurs during the forming of target 31 and square 34 on substrate 30 such that target 31 and square 34 have not been changed in size from the designed size for target 31 and square 34, then the positioning system will match center 36 of square 34 on the substrate 30 with the center 26 of square 24 on the mask resulting in edge 50 of the square 34 on the substrate 30 matching the edge 25 of square 24 on the mask 20.

Figure 4:
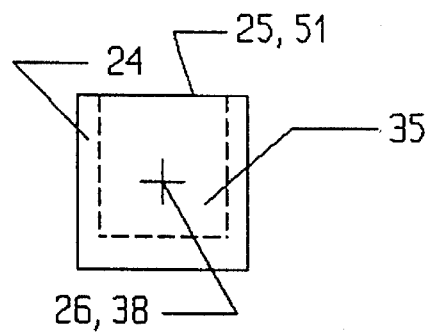
FIG. 4 is a drawing illustrating how the asymmetrical target of the invention allows an edge on the substrate to maintain a constant relationship with an edge on the mask.

If process variations cause the target and square to be smaller on substrate 30 such that target 32 (shown in dotted lines) having edge 52 and center 37 and square 35 having edge 51 and a reference point 38 is formed, the positioning system, as shown in FIG. 4, will match reference point 38 on the substrate 30 with center 26 of square 24 on the mask resulting in edge 51 of square 35 matching the edge 25 of square 24 on mask 20.

The asymmetrical target of the invention provides a means for maintaining the relationship of edges on the substrate to edges on subsequent masks thereby making the system insensitive to process variation in the forming of the target on the substrate.

While the invention has been described for maintaining an edge relationship to the top of the square, the relationship can be maintained to the right side of the square by rotating the target clockwise 90 degrees, to the bottom of the square by rotating the target 180 degrees and to the left side of the square by rotating the target clockwise 270 degrees.

While the invention has been particularly shown and described with reference to the preferred embodiments thereof, it will be understood by those skilled in the art that changes in form and detail may be made therein without departing from the spirit and scope of the invention. Given the above disclosure of general concepts and specific embodiments, the scope of the protection sought is defined by the following claims.

What is claimed is:

1. A system for compensating for process variations in forming a target and a pattern on a first object where said target and said pattern were formed from an initial mask having said target and said pattern thereon, said target being used in an automatic positioning system, said automatic positioning system deriving positioning information about the position of said first object having said target thereon relative to an alignment mask having a key where said positioning system views said target on said first object through said key on said alignment mask and derives positioning information from detecting edges of said target on said first object through said key in said alignment mask, said positioning system having a limited scanning range on both a first axis and on a second axis, said first and said second axes being orthogonal to each other, said target comprising:

first and second edges along said first axis where said first and second edges are detectable by said positioning system through said key;

a third edge on said second axis, only said third edge on said target being detectable in said limited scanning range by said positioning system through said key; and the center of said target being defined as the mid point between said first and second edges along said second axis and the location of said third edge along said first axis such that the center of said target will move along said first axis as a function of the size of said target, said target and said pattern being subject to process variations during manufacture resulting in the same variations in the size of said target and said pattern;

whereby said positioning system can align an edge in said pattern on said object with an edge in the pattern on said alignment mask without being affected by size variations in said target caused by process variations in forming said target and said associated pattern on said object.

2. The system of claim 1 where said target includes:

a leg portion including a first side and a second side where said first and said second sides define said first and said second edges; and a base portion including a third side where said third side defines said third edge.

3. A method for compensating for process variations in forming a target and a pattern on a first object where said target and said pattern were formed from an initial mask having said target and pattern thereon, said target being used in an automatic positioning system, said automatic positioning system deriving positioning information about the relative position of said first object having said target and an alignment mask having a key where said positioning system views said target on said first object through said key on said alignment mask and derives positioning information from detecting the edges of said target on said first object through said key in said mask, said positioning system having a limited scanning range on both a first axis and a second axis, said first and second axes being orthogonal to each other, said method comprising the steps of:

forming first and second edges for said target along said first axis where said first and second edges are detectable by said positioning system through said key;

forming a third edge for said target on said second axis where only said third edge on said second axis is detectable by said positioning system through said key; and establishing a center of said target as the mid point between said first and second edges along said second axis and the location of said third edge along said first axis such that said center of said target will move along said first axis as a function of the size of said target;

whereby said positioning system can align an edge in said associated pattern on said object with an edge in the pattern on said alignment mask without being affected by size variations in said target caused by process variations in forming said target and said associated pattern on said object.

* * * * *